(12) United States Patent
Choi et al.

(10) Patent No.: US 6,358,378 B2
(45) Date of Patent: Mar. 19, 2002

(54) METHOD FOR FABRICATING ZNO THIN FILM FOR ULTRAVIOLET DETECTION AND EMISSION SOURCE OPERATED AT ROOM TEMPERATURE, AND APPARATUS THEREFOR

(75) Inventors: Won Kook Choi; Hyung Jin Jung, both of Seoul; Kyeong Kook Kim; Young Soo Yoon, both of Kyunggi-do; Jong Han Song, Seoul, all of (KR)

(73) Assignee: Korea Institute of Science and Technology (KR)

( * ) Notice: Subject to any disclaimer, the term of this patent is extended or adjusted under 35 U.S.C. 154(b) by 0 days.

(21) Appl. No.: 09/767,822

(22) Filed: Jan. 24, 2001

(30) Foreign Application Priority Data

Jan. 26, 2000 (KR) .......................................... 2000-3690

(51) Int. Cl.[7] .............................................. C23C 14/34
(52) U.S. Cl. .............................. 204/192.15; 204/192.25
(58) Field of Search ........................ 204/192.12, 192.15, 204/192.26, 192.29, 192.25, 298.07, 298.19, 298.2, 298.26

(56) References Cited

U.S. PATENT DOCUMENTS

| | | | | |
|---|---|---|---|---|
| 4,888,062 A | * | 12/1989 | Nishikawa et al. | 136/258 |
| 5,514,485 A | * | 5/1996 | Ando et al. | 428/702 |
| 5,545,443 A | | 8/1996 | Yamada et al. | 427/584 |
| 5,569,548 A | * | 10/1996 | Koike et al. | 428/699 |
| 5,578,501 A | * | 11/1996 | Niwa | 204/192.29 |
| 5,942,090 A | * | 8/1999 | Ebisawa et al. | 204/192.15 |

* cited by examiner

Primary Examiner—Nam Nguyen
Assistant Examiner—Gregg Cantelmo
(74) Attorney, Agent, or Firm—Foley & Lardner

(57) ABSTRACT

An economical method of fabricating a high quality ZnO thin film with only NBE and without any deep-level emission at room temperature in order to replace conventional III-V group compounds such as GaN, and an apparatus therefor. The method comprises the steps of introducing argon (Ar) and oxygen ($O_2$) into a vacuum chamber while maintaining a vacuum level of 1–100 mTorr in the vacuum chamber, preheating a substrate, depositing a ZnO monocrystal thin film on the substrate by RF magnetron sputtering while introducing carbon(C) or nitrogen (N) atoms from an atomic radical source installed over the substrate, and slowly cooling the substrate while maintaining a partial pressure of oxygen in the vacuum chamber at a partial pressure level used while depositing the ZnO thin film.

9 Claims, 6 Drawing Sheets

METHOD FOR FABRICATING ZNO THIN FILM FOR ULTRAVIOLET DETECTION AND EMISSION SOURCE OPERATED AT ROOM TEMPERATURE, AND APPARATUS THEREFOR

BACKGROUND OF THE INVENTION

1. Field of the Invention

The present invention relates to a method of fabricating a high quality ZnO thin film, which is a new II-IV material that can replace ultraviolet (UV) and blue light emitting diodes (LED's), laser diode (LD) emission devices based on GaN semiconductors that are III-V nitrides. The ZnO thin film of the present invention can also replace UV detectors utilizing AlN-GaN alloy $(Al_xGa_{1-x}N)m$, is devoid of any green-yellow deep-level emission peak typically observable at room temperature in bulk crystals, and emits only a pure near band edge ("NBE") UV corresponding to an energy level of 3.3 eV. The present invention also relates to a method of fabricating UV emission and detection devices utilizing such high quality ZnO thin film as their base material, and to a method of fabricating thin films that can replace III-V nitrides for use in UV/blue LED's and LD's.

2. Description of the Prior Art

ZnO thin films have been used as the base material for reducing gas sensors such as $SnO_2$ and as photoconductive material. Because it is easy to grow crystals of ZnO along the c-axis, it has been used as thin film material for varisters and surface acoustic filters utilizing its good piezoelectric characteristics. On the other hand, ZnO of the II-VI group has a direct bandgap structure with an optical energy bandgap of 3.37 eV at room temperature.

Up to now, SiC based compounds of the IV group, ZnSe based compounds of the II-VI group, and GaN of the III-V group compound has been used as the thin film material for UV emission devices.

SiC has an advantage that addition of p-type or n-type impurities and control of conductivity are easy. Thus, SiC has been developed in the late 1980's as material for millicandela (mcd) level low-brightness blue LED's. However, SiC is not suitable for high-brightness blue LED's because SiC has an indirect energy bandgap structure.

Therefore, ZnSe based material having a direct energy bandgap has been used for high brightness blue LED's. The characteristics of ZnSe crystal is good, because ZnSe has a low lattice mismatch with GaAs used as the substrate. However, because molecular beam epitaxy (MBE) is typically used to grow ZnSe crystals, it is difficult to add and control elements such as Zn, Se, Mg, or S having high element pressure and to add p-type impurities.

GaN of the III-V group compound, which was developed in the 1990's, has a direct bandgap structure and a very high lattice mismatch with sapphire substrates. Thus, the dislocation density between the sapphire substrate and the GaN thin film is great. Nevertheless, GaN shows very good characteristics of UV/blue emission. However, because such great dislocation density adversely affects the lifetime of high-power laser diodes, it was necessary to develop a new buffer material.

In this regard, ZnO has been proposed as the buffer material between sapphire substrates and GaN, because ZnO has the same Wurtzite crystal structure as that of GaN and the lattice mismatch between ZnO and GaN is only 2.2%. By using ZnO as the buffer material between the sapphire substrate and GaN, it is possible to reduce the dislocation density in the boundary between the sapphire substrate and GaN caused by the great lattice mismatch (16.7%) when growing the GaN thin film.

ZnO is a wide bandgap (3.37 eV) semiconductor having a direct energy bandgap. Thus, the optical characteristics of ZnO are similar to those of GaN used as material for conventional UV/blue emission diodes (LED's) and LD's. Especially, ZnO has a high excitation binding energy (60 meV) at room temperature, resulting in more efficient emission than GaN. Also, ZnO has a low threshold energy for stimulated spontaneous emission by laser pumping. In addition, it is possible to grow thin films of ZnO at a lower temperature (500–600° C.) than that required for III-V nitrides, because III-V nitrides require preheating of the substrate at a temperature in excess of 1000° C. Therefore, there are various options for the material used as the substrate when growing a ZnO thin film.

However, conventional methods of fabricating ZnO thin films had a disadvantage that the ZnO thin film was Zn-rich due to oxygen deficiency, such that the ZnO thin film is grown as a nonstoichiometric thin film having the characteristics of an n-type semiconductor. Other disadvantages were that, because of the effect of other impurities, the ZnO thin film showed a greenish-yellow peak due to deep-level defect having an energy of about 2.4–2.6 eV along with a UV peak due to NBE shift having an energy of about 3.37 eV, when it was subject to an optical characteristics test by using photoluminescence (PL). Such deep level defect peak due to impurities adversely affects the efficiency and characteristics of high-purity UV/blue emission devices and thus should be eliminated.

Conventional methods of fabricating ZnO thin films include reactive e-beam evaporation, sputtering, chemical vapor deposition (CVD), and spray pyrolysis. However, these conventional methods all had disadvantages that they failed to fabricate stoichiometric ZnO thin films and merely produced polycrystalline thin films of ZnO.

ZnO thin films to be used as optical material require high quality crystal property and uniformity. In order to fabricate such high quality ZnO thin films, methods such as metalorganic CVD, molecular beam epitaxy, and pulsed laser deposition have been recently used. However, all of these methods have a disadvantage that they are very expensive. In contrast, sputtering is a type of physical vapor deposition (PVD) and has advantages of high-speed growth of the thin film, capability of large area growth, and low cost. However, no effort has been made to grow high quality ZnO thin films by using sputtering for optoelectronic devices such as LED and LD.

SUMMARY OF THE INVENTION

Therefore, it is an object of the present invention to provide an economical method of fabricating high quality ZnO thin films showing only NBE without any deep level emission at room temperature, in order to replace GaN which is a III-V compound. It is also an object of the present invention to provide an apparatus for implementing such method of the present invention.

To this end, the method of the present invention for fabricating a ZnO thin film for use in ultraviolet detection and emission devices operable at room temperature comprises the steps of introducing argon (Ar) and oxygen ($O_2$) into a vacuum chamber while maintaining a vacuum level of 1–100 mTorr in the vacuum chamber, preheating a substrate, depositing a ZnO monocrystal thin film on the substrate by RF magnetron sputtering while introducing carbon (C) or nitrogen (N) atoms from an atomic radical source installed over the substrate, and slowly cooling the substrate while maintaining a partial pressure of oxygen in the vacuum chamber at a partial pressure level used while depositing the ZnO thin film.

Preferably, the ratio of argon (Ar) to oxygen ($O_2$) is less than 4/1, and more preferably in the range of 1/1 to 3/1. The substrate is preferably preheated to a temperature range of 500–650° C. The energy density per unit effective area applied to the target is 3.9–7.4 $W/cm^2$ during the RF magnetron sputtering. The substrate may be one selected from the group consisting of a $Al_2O_3$ monocrystal substrate, a monocrystal substrate such as Si having a large lattice mismatch with ZnO, and a substrate using the ZnO as a buffer.

In addition, the present invention provides a RF magnetron sputtering apparatus for fabricating ZnO thin films used in ultraviolet detection and emission devices operable at room temperature, wherein a target and a substrate are horizontally arranged and an atomic radical source is installed over the substrate for p-type doping.

DESCRIPTION OF THE PREFERRED EMBODIMENT

The preferred embodiments of the present invention will be described hereinafter with reference to the attached drawings.

Conventionally, ZnO thin films have been fabricated on glass (e.g., corning 7059 or borosilicate), $SiO_2/Si$, or almunina substrates in the form of polycrystal by RF magnetron sputtering. Research has been made regarding the use of ZnO thin films in gas sensors, transparent electrodes, and SAW filters. However, little, if any, research has been made regarding fabrication of ZnO thin films on a monocrystal substrate for use in UV emission devices, and even if fabricated, the PL characteristics were bad due to deep-level emission at room temperature.

In conventional vertical sputtering apparatuses, the target and substrate face each other perpendicularly. On the other hand, the present invention employs a horizontal RF magnetron sputtering apparatus. With the structure of the RF magnetron sputtering apparatus of the present invention, only particles having a certain amount of kinetic energy or horizontal momentum, among the neutral Zn—O molecules or Zn or O atoms sputtered from the target, can reach and be deposited on the substrate. As a result, a much more uniform thin film can be obtained compared with conventional vertical sputtering apparatuses. In addition, an atomic source is placed over the substrate so that N or C can be doped in the ZnO thin film for p-type doping, which is very important as it is in the fabrication of GaN-based LED's and LD's.

Figure 1:
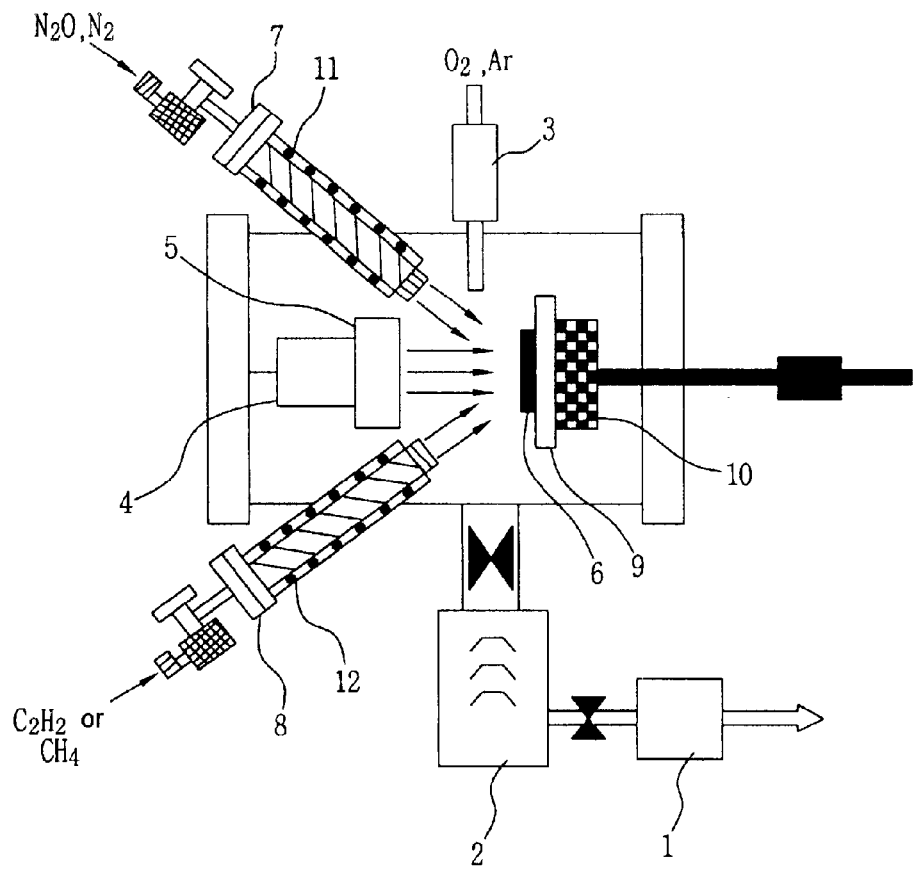
FIG. 1 is a schematic diagram of a horizontal RF magnetron sputtering apparatus according to the present invention.

Referring to FIG. 1, gas is exhausted to $1\times10^{-6}$ Torr using the rotary pump 1 and the diffusion pump 2. Then, a gas mixture of Ar and $O_2$ is introduced using the mass flow controller (MFC) 3, such that the vacuum level in the chamber is 1–100 mTorr. In this level of deposition vacuum level, in order to perform sputtering of the target 5 which is placed above the RF sputter gun 4 and comprised of the material to be deposited, RF electrical energy is applied to the RF magnetron sputter gun 4 such that the gas mixture of argon and oxygen is ionized. Such ions are bombarded to the target 5 to sputter the target material, and in this manner the target material is deposited on the substrate 6. The two atomic radical sources 7 and 8 installed over the substrate 6 are used to dope the growing ZnO thin film with N and C. The shape of the atomic radical sources 7 and 8 is such that RF coils 11 and 12 are wound around crystal tubes having diameters of about 1 inch. When RF power is applied, molecular gases $N_2O$ (or $N_2$) and $C_2H_2$ (or $CH_4$) introduced to the respective atomic radical sources 7 and 8 are dissolved into N and C atoms which are prone to chemical reaction and propelled to the substrate 6.

The substrate 6 is (i) $Al_2O_3$ (0001) (sapphire) monocrystal substrate having directivity only along the c-axis in order to enhance the crystal property of the ZnO thin film, or (ii) Si substrate with a native oxide layer which is used commonly and has no directivity along the c-axis and has a greater lattice mismatch than that of sapphire substrates. The preheating of the substrate 6 to a temperature of up to 650° C. is carried out using the halogen lamp (three 400 W lamps) 10 operable in low pressure, so that no oxidation occurs in the plasma mixture of Ar and $O_2$ and no breakdown of electrical insulation occurs in the conductive plasma. The distance between the target 5 and the substrate 6 can be in the 10–100 mm range. The ratio of Ar to $O_2$ can be in the range of 4/1 to 1/1. The vacuum level during deposition can be in the range of 1–100 mTorr. Using a 2-inch target, a ZnO thin film of a thickness of thousands of Å to thousands of $\mu m$ was fabricated by changing the RF (13.56 MHz) power in the range of 80–150 W. If the size of the target is increased, the required RF power is also increased accordingly. The energy density per unit effective area of the target is preferably 3.9–7.4 $W/cm^2$.

The sapphire substrate 6 is cleaned using ultrasound in trichloroethylene (TCE) for 12 minutes, and then cleaned in acetone, methanol, deionized water sequentially. Thereafter, the sapphire substrate 6 is placed on the substrate holder 9 in a nitrogen atmosphere. The reaction chamber is exhausted using the rotary pump 1 and the diffusion pump 2 to a vacuum level of $1 \times 10^{-6}$ Torr. Oxygen and argon gas are controlled by the mass flow controller 3, and the substrate 6 is preheated slowly for about 2 hours. After the thin film is fabricated using the ZnO target, it is slowly cooled for 1 hour in the vacuum chamber having the same partial pressure of oxygen as that used during fabrication of the thin film. Such a cooling process inhibits the growth of nonstoichiometric ZnO due to oxygen deficiency and sufficiently diffuses oxygen in the thin film, resulting in a high-quality thin film.

Embodiments

The First Embodiment: ZnO/Sapphire (0001)

RF Power: 60–120 W

Plasma atmosphere gas: $Ar/O_2=1/1$, Total Pressure=10 mTorr

Substrate: $Al_2O_3$ (0001) monocrystal (size: 5 mm×5 mm)

Substrate Preheating Temperature: 500–650° C.

Target: Sintered ZnO of commercial quality (99.999%)

Thickness of Thin Film: 0.1–5 $\mu$m

Distance to Target: 60 mm

Figure 2:
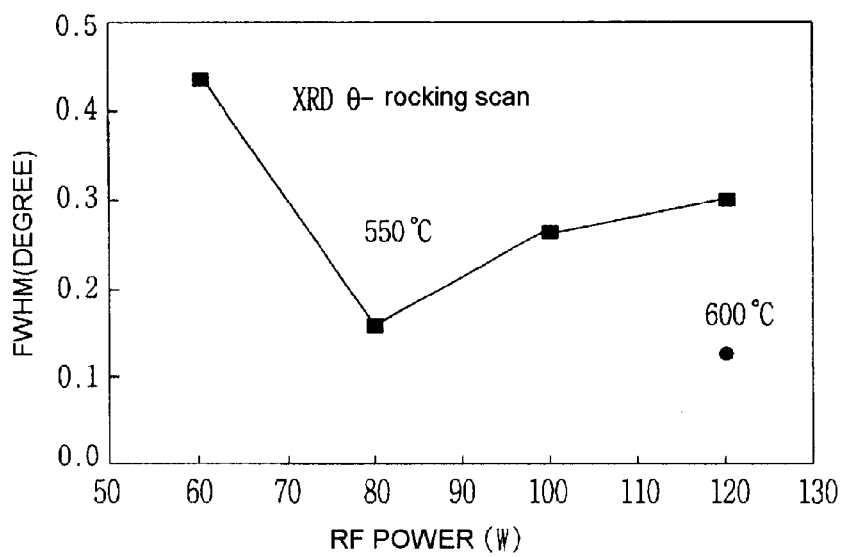
FIG. 2 is a diagram illustrating the change of full width at half maximum (FWHM) of ZnO (002) peak θ-rocking of the X-ray diffraction against the ZnO thin film fabricated according to the method of the present invention.

FIG. 2 is a diagram illustrating the FWHM of the θ-rocking curve obtained from the X-ray θ-rocking curve with respect to the ZnO (002) peak. The ZnO (002) peak is with respect to a ZnO thin film of 1–2 $\mu$m fabricated under the above conditions of the first embodiment in the apparatus of FIG. 1. The θ-rocking curve represents the degree of crystallization of the thin film along the c-axis. When the preheating temperature of the substrate is 550° C., the FWHM is 0.44° at 60 W RF power. The FWHM shows the best degree of crystallization of 0.15° at 80 W RF power. For greater RF powers, the FWHM is steadily increased to 0.28° at 120 W RF power. When the preheating temperature of the substrate is 600° C., the FWHM is very small, i.e., 0.13° at 120 W RF power.

Figure 3:
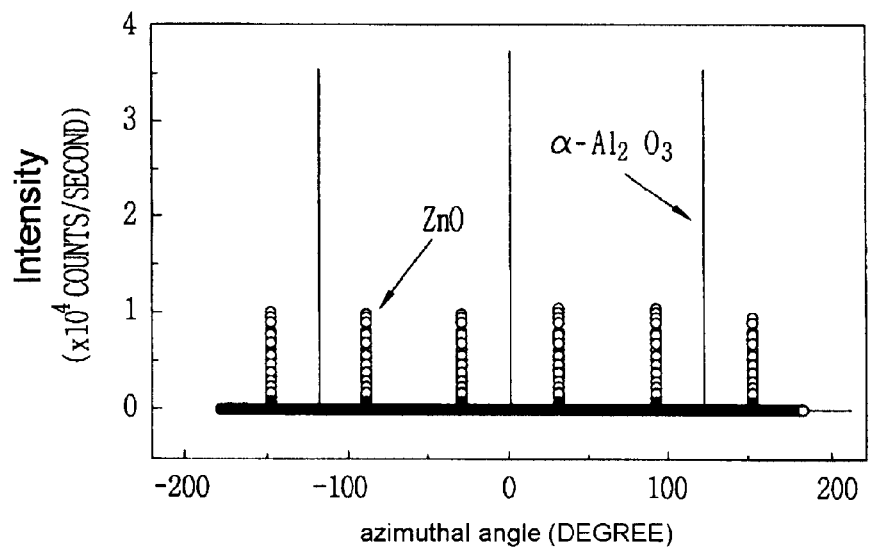
FIG. 3 is a diagram illustrating the X-ray diffraction in-plane ψ-scan of the ZnO thin film fabricated on a $Al_2O_3$ (0001) (sapphire) substrate by the horizontal RF magnetron sputtering apparatus of the present invention.

FIG. 3 shows the growth relation between the sapphire monocrystal used as the substrate and the ZnO thin film. The sapphire substrate shows 3-fold symmetry, while the ZnO (012) face shows 6-fold symmetry. The ZnO thin film is shown to have grown along the c-axis and rotated 30° with respect to the sapphire substrate.

Figure 4:
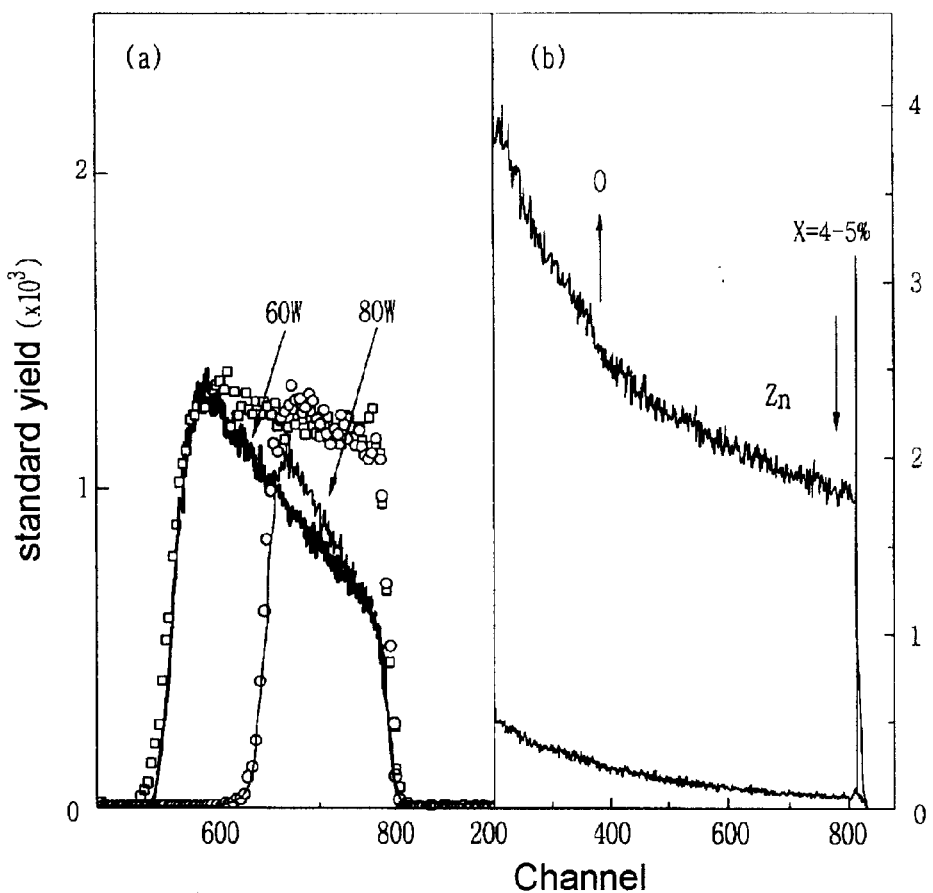
FIG. 4 is a diagram illustrating the Rutherford backscattering (RBS) channeling spectrum of the ZnO thin film, wherein (a) shows the results when deposited under the conditions of substrate temperature 600° C. and RF power 60 W and 80 W, and (b) shows the results when deposited under the conditions of substrate temperature 600° C. and RF power 120 W.

FIG. 4 is a diagram illustrating the Rutherford backscattering (RBS) channeling spectrum of the ZnO thin film, which can be used to measure the degree of crystallization of the ZnO thin film. First, (a) shows RBS channeling spectrum data of the ZnO thin film which was fabricated under a temperature of 600° and RF power of 60 W and 80 W. The channeling yield on the all surfaces of the thin film was about 50% when the RF power was 60 W (denoted as "□") or 80 W (denoted as "o"). However, at the boundary between the thin film and sapphire, there was almost no channeling at 60 W, and a little channeling at 80 W. In contrast, in the ZnO thin film fabricated under a temperature of 600° C. and RF power of 120 W (shown in (b)), the minimum channeling yield was 5%, which represents a very good degree of crystallization (Typically, general Si monocrystals have a channeling yield of 4%). Here, the channeling yield is the ratio of backscattered $^4He^{2+}$ ions which were incident in a random direction to the backscattered $^4He^{2+}$ ions which were incident aligned, obtained in a RBS channeling spectrum test using 2 MeV $^4He^{2+}$ ions.

Figure 5:
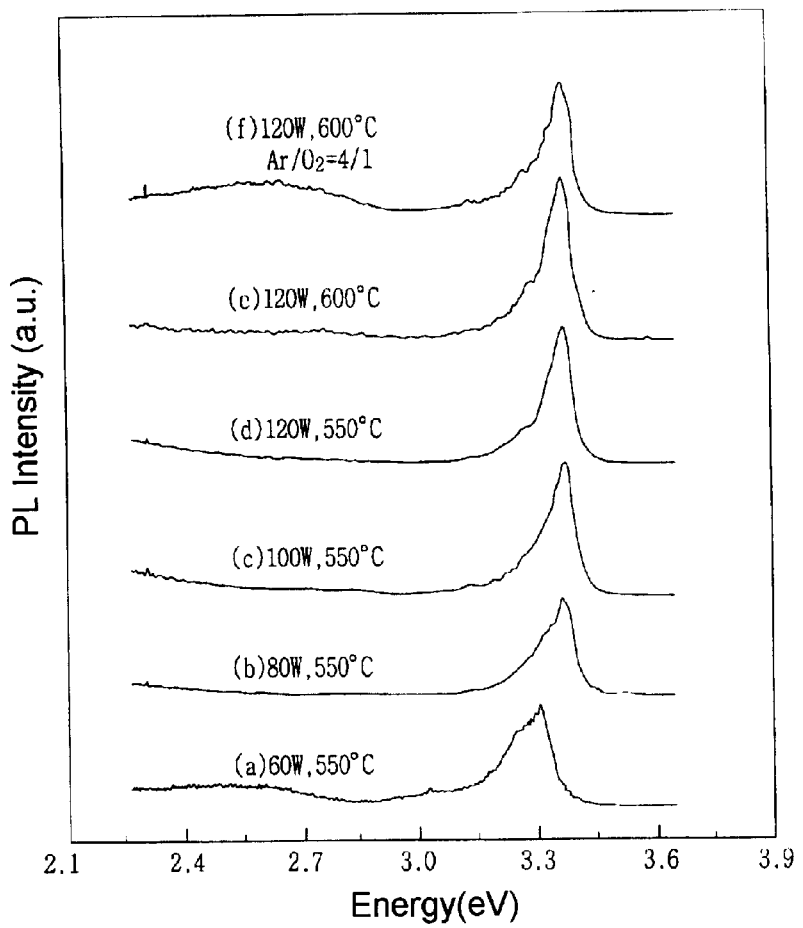
FIG. 5 is a diagram illustrating the photoluminescence (PL) characteristics of the ZnO thin film fabricated according to a first embodiment of the present invention.

FIG. 5 is a diagram illustrating the photoluminescence (PL) characteristics spectrum of the ZnO thin film measured at room temperature using a 40 mW He-Cd laser (wavelength $\lambda=325$ nm). As shown in FIG. 5, the ZnO thin film deposited under conditions of 60 W RF power and 550° C. temperature shows NBE UV emission at around 3.3 eV, except that it also shows a little of wide deep-level emission at 2.4–2.6 eV. The points of UV emission are as follows: 3.302 eV under conditions of 60 W RF power and 550° C. temperature, 3.361 eV under conditions of 80 W RF power and 550° C. temperature, 3.365 eV under conditions of 100 W RF power and 550° C. temperature, 3.37 eV under conditions of 120 W RF power and 550° C. temperature, 3.3705 eV under conditions of 120 W RF power and 600° C. temperature. Therefore, the NBE UV emission is ideal as in bulk ZnO when the ZnO thin film is fabricated under conditions of 120 W RF power and 550–600° C. temperature.

Figure 6:
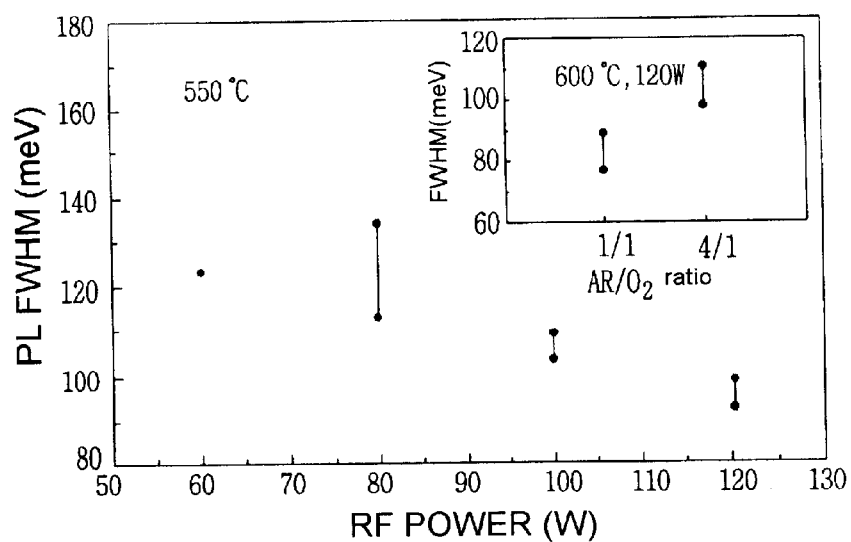
FIG. 6 is a diagram illustrating the change of FWHM of the PL characteristics curve in FIG. 5 according to the RF power and the $Ar/O_2$ gas ratio.

FIG. 6 is a diagram illustrating the FWHM of the PL characteristics curve in FIG. 5. The FWHM values are as follows: 123 meV under conditions of 60 W RF power and 550° C. temperature, 133 meV under conditions of 80 W RF power and 550° C. temperature, 100 meV under conditions of 100 W RF power and 550° C. temperature, 89 meV under conditions of 120 W RF power and 550° C. temperature, and 79 meV under conditions of 120 W RF power and 600° C. temperature. Thus, the FWHM of the PL characteristics of the ZnO thin film is better at room temperature than that of any other ZnO thin film fabricated by any other method.

Figure 7:
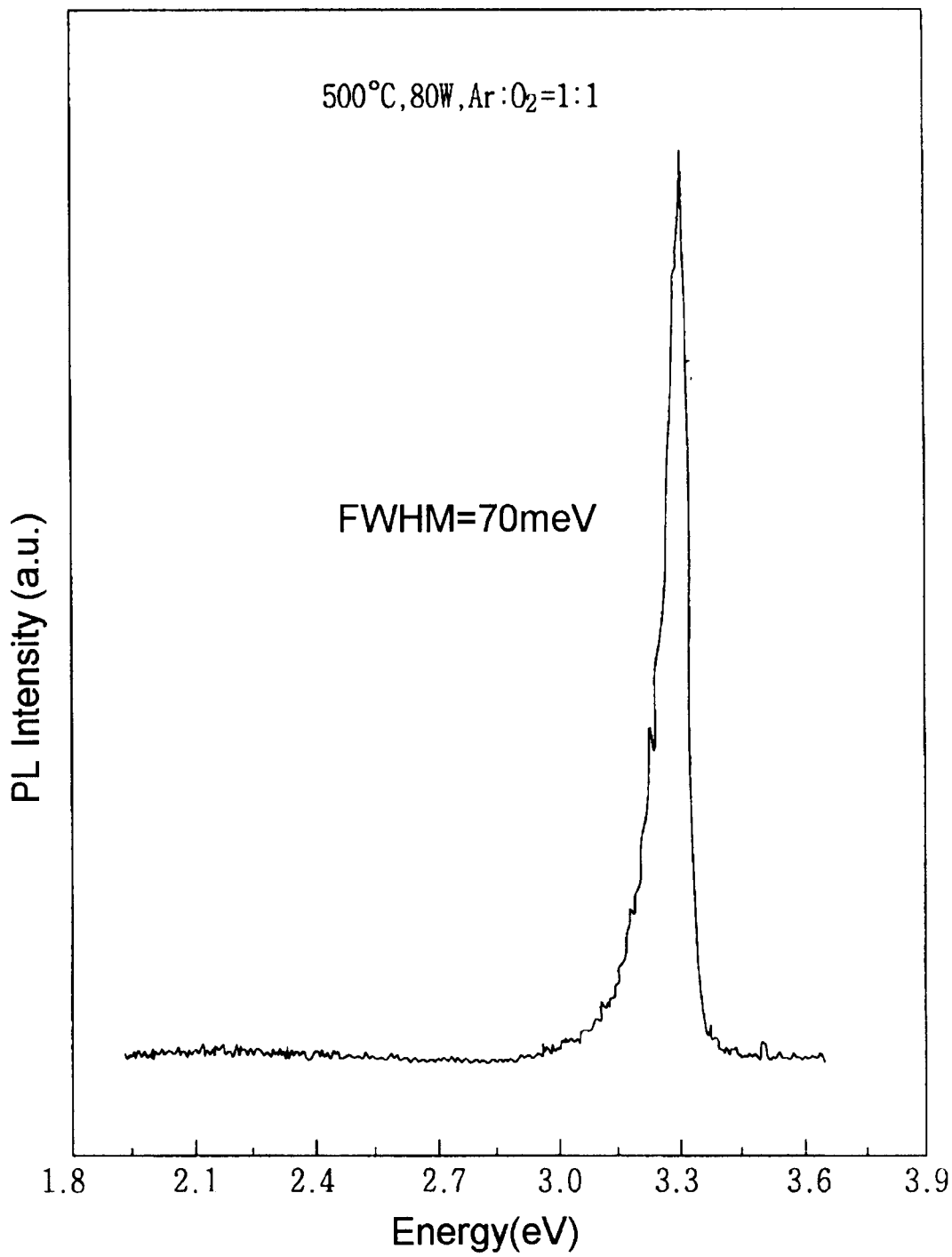
FIG. 7 is a diagram illustrating the photoluminescence characteristics of a ZnO thin film fabricated according to the present invention under conditions of RF power of 80 W, temperature of 500° C., and partial pressure of Argon to Oxygen of 1/1.

FIG. 7 is a diagram illustrating the photoluminescence characteristics of a ZnO thin film fabricated according to the present invention while maintaining the substrate temperature at 500° C. As shown in FIG. 7, the FWHM of NBE is about 70 meV, which represents very good optical properties.

The Second Embodiment: ZnO/Sapphire (0001)

RF Power:120 W

Plasma atmosphere gas: $Ar/O_2=1/1-4/1$, Total Pressure= 10 mTorr

Substrate: $Al_2O_3$ (0001) monocrystal (size: 5 mm×5 mm)

Substrate Preheating Temperature: 600° C.

Target: Sintered ZnO of commercial quality (99.999%)

Thickness of Thin Film: 0.1–1 $\mu$m

Distance to Target: 60 mm

Figure 8:
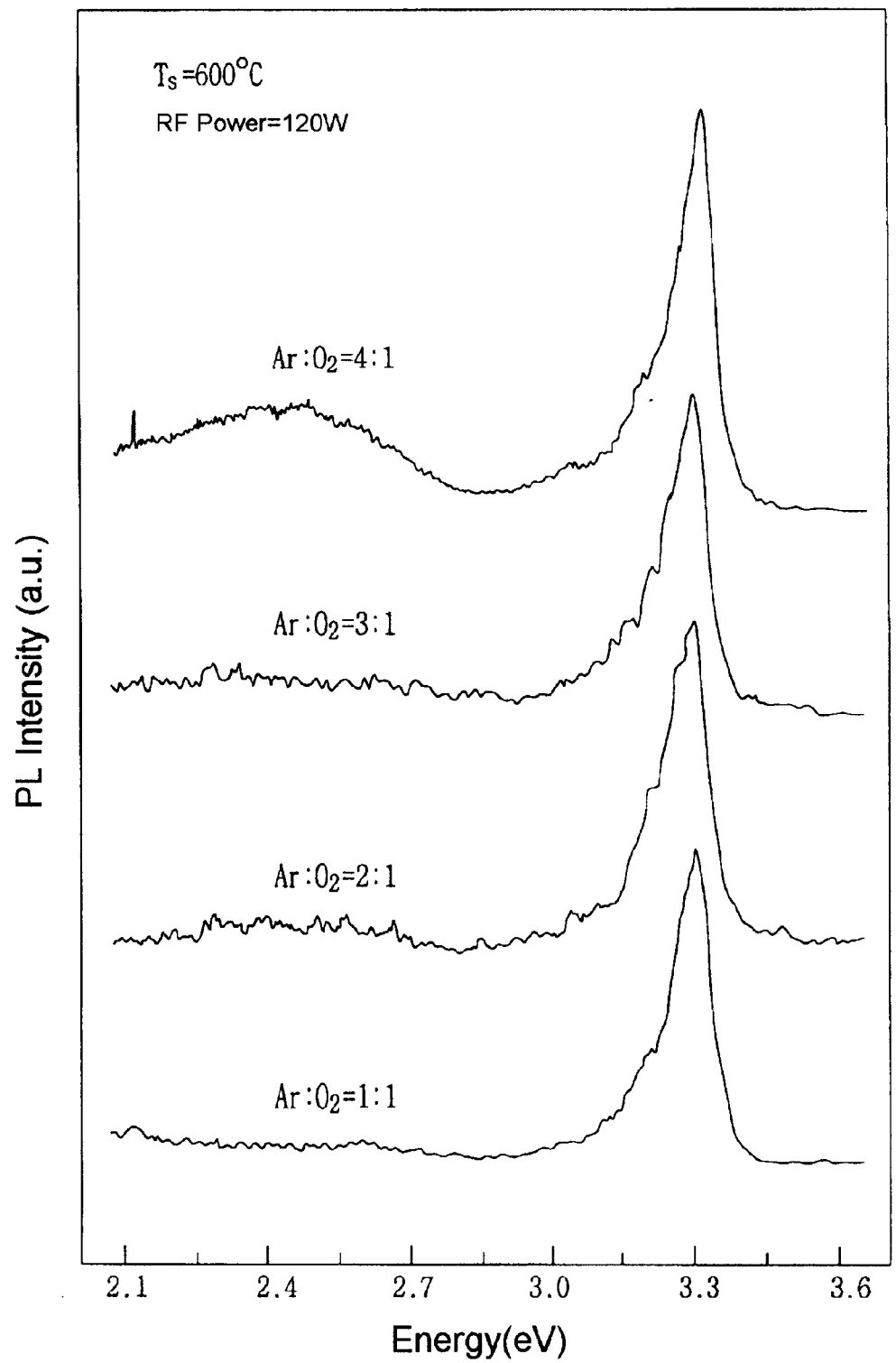
FIG. 8 is diagram illustrating the photoluminescence characteristics of a ZnO thin film fabricated according to a second embodiment of the present invention.

FIG. 8 is a diagram of the PL characteristics curve of the ZnO thin film grown under the above conditions of the second embodiment. The PL characteristics show deep-level emission at the partial pressure ratio of 4/1, when the partial pressure ratio of $Ar/O_2$ is changed from 1/1 to 4/1. That is, only clean NBE can be observed when the partial pressure ratio of $Ar/O_2$ is 1/1–3/1, whereas deep-level emission increases when the partial pressure ratio of $Ar/O_2$ is 4/1 due to oxygen deficiency. Thus, the preferable partial pressure ratio of $Ar/O_2$ for fabrication of high-quality ZnO thin films is 1/1–3/1.

The Third Embodiment: ZnO/Si (100)

RF Power: 60 W

Plasma atmosphere gas: $Ar/O_2=1/1-4/1$, Total Pressure= 10 mTorr

Substrate: Si (100) wafer (size: 10 mm×10 mm)

Substrate Preheating Temperature: 550–650° C.

Target: Sintered ZnO of commercial quality (99.999%)

Thickness of Thin Film: 0.1–1.5 $\mu$m

Distance to Target: 60 mm

Figure 9:
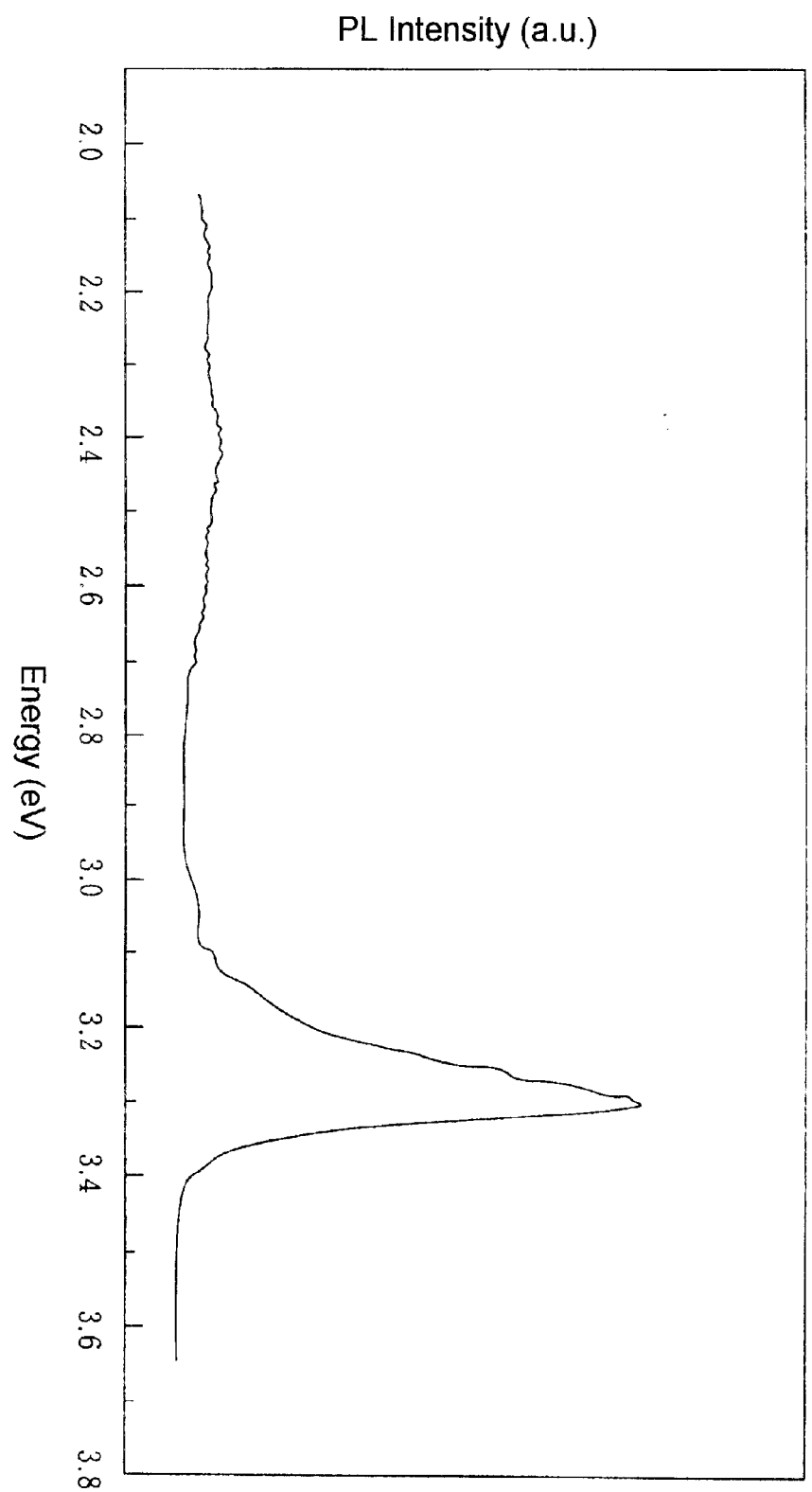
FIG. 9 is a diagram illustrating the room temperature emission characteristics curve of the ZnO thin film fabricated on Si (100) substrate with a thickness of 5000 Å according to a third embodiment of the present invention.

Under the above conditions, the Si (100) wafer having a native oxide layer is cleaned and installed in a vacuum chamber within $N_2$ atmosphere. Then, the vacuum chamber is exhausted, and the ZnO thin film is deposited. No research other than the present invention showed emission characteristics having only NBE without any deep-level emission at room temperature, when ZnO was deposited over Si crystal. FIG. 9 is a diagram of a PL characteristics curve obtained by exciting the ZnO thin film using a He-Cd laser (wavelength λ=365 nm, P=40 mW), wherein the ZnO thin film was deposited under the above conditions of the third embodiment for 1 hour. No deep-level emission was observed, and only a clean NBE emission peak at 3755 Å (3.302 eV) was observed. The FWHM was 93.52 meV, resulting in a ZnO thin film of very good optical properties.

Si (100) has a lattice mismatch with ZnO that is larger than the lattice mismatch of 16.7% between ZnO and sapphire. Thus, it can be expected that the dislocation density at the boundary between Si and ZnO will be great. Nevertheless, NBE can be observed in the ZnO thin film fabricated on Si. Thus, it can also be expected that ZnO thin films with good optical properties can likewise be obtained by depositing ZnO directly or as a buffer layer on other monocrystal material with great lattice mismatch.

According to the present invention, a high-quality ZnO thin film with only NBE and without any deep-level emission at room temperature can be economically fabricated. Thus, the ZnO thin film can replace conventional III-V group compounds such as GaN.

Although the present invention has been illustrated with reference to embodiments of the present invention, various modifications are possible within the scope of the present invention by a person skilled in the art. Therefore, the scope of the present invention should be defined not by the illustrated embodiments but by the attached claims.

What is claimed is:

1. A method of fabricating a ZnO thin film for use in ultraviolet detection and emission devices, the method comprising the steps of:

introducing argon (Ar) and oxygen ($O_2$) into a vacuum chamber while maintaining a vacuum level of 1–100 mTorr in the vacuum chamber;

preheating a substrate;

depositing a ZnO monocrystal thin film on the substrate by RF magnetron sputtering while introducing carbon (C) or nitrogen (N) atoms from an atomic radical source installed over the substrate for p-type doping; and cooling the substrate while maintaining a partial pressure of oxygen in the vacuum chamber at a partial pressure level used while depositing the ZnO thin film.

2. The method of fabricating a ZnO thin film for use in ultraviolet detection and emission devices as claimed in claim 1, wherein a ratio of argon (Ar) to oxygen ($O_2$) is less than 4/1.

3. The method of fabricating a ZnO thin film for use in ultraviolet detection and emission devices as claimed in claim 2, wherein the ratio of argon (Ar) to oxygen ($O_2$) is 1/1 to 3/1.

4. The method of fabricating a ZnO thin film for use in ultraviolet detection and emission devices as claimed in claim 1, wherein the substrate is preheated to a temperature range of 500–650° C.

5. The method of fabricating a ZnO thin film for use in ultraviolet detection and emission devices as claimed in claim 1, wherein an energy density per unit effective area applied to a target is 3.9–7.4 W/cm$^2$ during the RF magnetron sputtering.

6. The method of fabricating a ZnO thin film for use in ultraviolet detection and emission devices as claimed in any one of claims 1–4, wherein the substrate is one selected from the group consisting of $Al_2O_3$ monocrystal substrate, Si monocrystal substrate, and a substrate using the ZnO as a buffer.

7. A RF magnetron sputtering apparatus for fabricating ZnO thin films used in ultraviolet detection and emission devices, wherein a target and a substrate are horizontally arranged and an atomic radical source is installed over the substrate for p-type doping.

8. A method of fabricating a ZnO thin film for use in ultraviolet detection and emission devices, the method comprising the steps of:

preheating a substrate; and depositing a ZnO monocrystal thin film on the substrate by RF magnetron sputtering while introducing carbon (C) or nitrogen (N) atoms from an atomic radical source installed over the substrate for p-type doping.

9. A method of fabricating a ZnO thin film for use in ultraviolet detection and emission devices, the method comprising the steps of:

preheating a substrate;

depositing a ZnO monocrystal thin film on the substrate by RF magnetron sputtering while introducing carbon (C) or nitrogen (N) atoms from an atomic radical source installed over the substrate for p-type doping; and cooling the substrate while maintaining a partial pressure of oxygen in the vacuum chamber at a partial pressure level used while depositing the ZnO thin film.

* * * * *